INVENTORS
ERNST A. GUTBIER
WILLIAM C. SCHMIDT
By J. J. Lipari
ATTORNEY

CIRCUIT BOARD AND METHOD OF CONNECTING CONNECTORS THERETO

Filed April 16, 1965 6 Sheets-Sheet 5

United States Patent Office 3,361,869
Patented Jan. 2, 1968

3,361,869
CIRCUIT BOARD AND METHOD OF CONNECTING CONNECTORS THERETO

Ernst A. Gutbier, Atkinson, N.H., and William C. Schmidt, Andover, Mass.; said Gutbier assignor to Western Electric Company, Incorporated, New York, N.Y., a corporation of New York, and said Schmidt assignor to Bell Telephone Laboratories, Incorporated, Murray Hill, N.J., a corporation of New York Filed Apr. 16, 1965, Ser. No. 448,643
15 Claims. (Cl. 174—68.5)

This invention relates to printed circuit boards and particularly to an improved circuit board and a method of forming and connecting connectors to preselected areas of circuitry disposed on opposite sides of the circuit board.

In the manufacture of circuit boards having circuits on opposite sides thereof, electrical interconnections of the circuits are customarily effected through one or several holes extending through the board and terminating in preselected circuit areas, oftentimes referred to as land areas, by either a plated-through-hole or a resistance fused eyelet. With the use of plated-through-holes, the surface finish of the board hole is critical and several operations are required thereby resulting in relatively high costs. With resistance fused eyelets, a circular flange is formed in the head portion of the eyelet over the land area which subsequently is solder connected thereto. However, due to the soldering of the entire flange of the eyelet with the land area, at times, when stresses were built up in the boards, e.g., due to thermal expansion, the solder connection would crack and thereby cause the circuit to open.

Accordingly, it is an object of this invention to provide a new method of forming and clinching connectors to preselected areas of a circuit board.

Another object of this invention is to provide a new method of forming and connecting connectors to preselected areas of circuitry located on opposite sides of a circuit board.

Still another object of this invention is to provide a new and improved circuit board.

A method, illustrating certain aspects of the invention, for forming and clinching connectors to preselected areas of circuitry disposed on directly opposite sides of a circuit board includes the steps of forming a hole in the circuit board a predetermined distance from the preselected areas, feeding a predetermined length of conducting strand material through said hole such that portions of the strand material extend predetermined distances beyond opposite sides of the circuit board, and bending said portions of the strand material firmly against their respective preselected areas so as to form a connector which interconnects said preselected areas.

In general, the circuit board, illustrating certain aspects of the invention, comprises a dielectric substrate having circuit paths located on opposite sides of the substrate. At least one hole extends through the substrate and has end portions spaced a predetermined distance from preselected areas of the circuit paths. A conducting strand of material extends through the hole and has bent end portions interconnecting their respective preselected areas of circuitry.

Other objects and advantages will be apparent from the following detailed description when considered in conjunction with the accompanying drawings, wherein:

FIG. 1*a* is an isometric view of the circuit board of the present invention with a partial cross-section illustrating the connection of preselected areas of circuitry disposed on opposite sides thereof;

FIG. 1*b* is an end view of the circuit board as shown in FIG. 1*a* showing in greater detail the manner in which the connection is made between the preselected areas of circuitry by a naturally bent wire;

Figure 8:
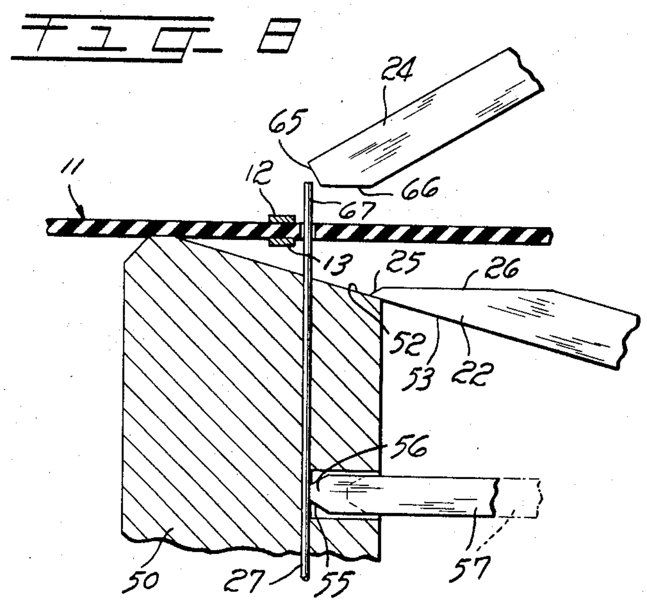
Figure 9:
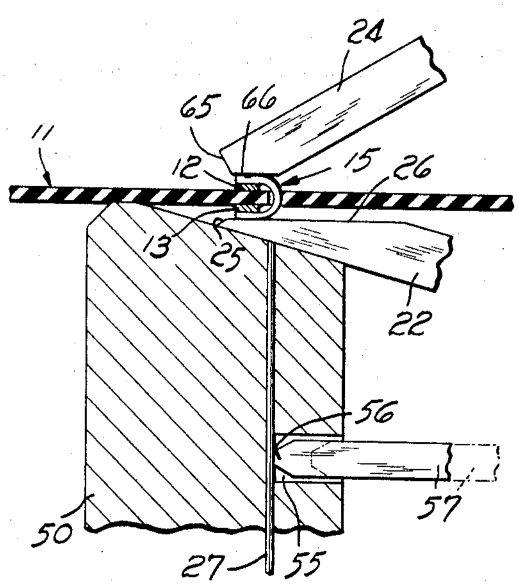

FIG. 8 is an enlarged fragmentary view depicting the bending tool, and the cutting and forming tool, prior to their forming and clinching of a connector to preselected circuit areas of a circuit board; and FIG. 9 is an enlarged fragmentary view depicting the bending tool, and the cutting and forming tool, after their forming and clinching of a connector to preselected circuit areas of a circuit board.

For purpose of the invention, the base material or substrate 10 of the circuit board 11 is of the paper-phenolic type but may be of any of the well known types such as epoxy glass, paper epoxy, epoxy coated metal, etc. Circuit paths 12 and 13 may be located on directly opposite sides of the circuit board and may be produced by any of the techniques known in this field, for instance, by an etch foil technique. The circuit paths may either represent a complete circuit system or component, or two paths may complement each other to form the complete circuit system or component.

A hole or aperture 14 is drilled through the circuit board 11, at a suitable time during the processing of the boards a spaced distance from the circuit paths. The hole 14 is of a diameter sufficiently larger than the diameter of a wire connector or lead 15 interconnecting the circuit paths 12, 13, the forming and connecting of the connector 15 to be described in detail hereinafter. For example, a wire connector having a diameter of approximately .025" has been found to be quite suitable for insertion through a .043" diameter hole so as to accommodate any thermal stresses built up in the board 11. It has been found that when the diameter of the hole is approximately twice the diameter of the wire connector in a board having a thickness of .062", there is a natural bend of the wire which preferably makes a three point contact with portions of the wall of the hole 14 at A, B, and C. As a result, there is a minimum of contact of the wire with the substrate 10 thereby resulting in the wire having a relatively high degree of flexibility during the build up of any thermal stresses in the substrate.

Figure 1A:
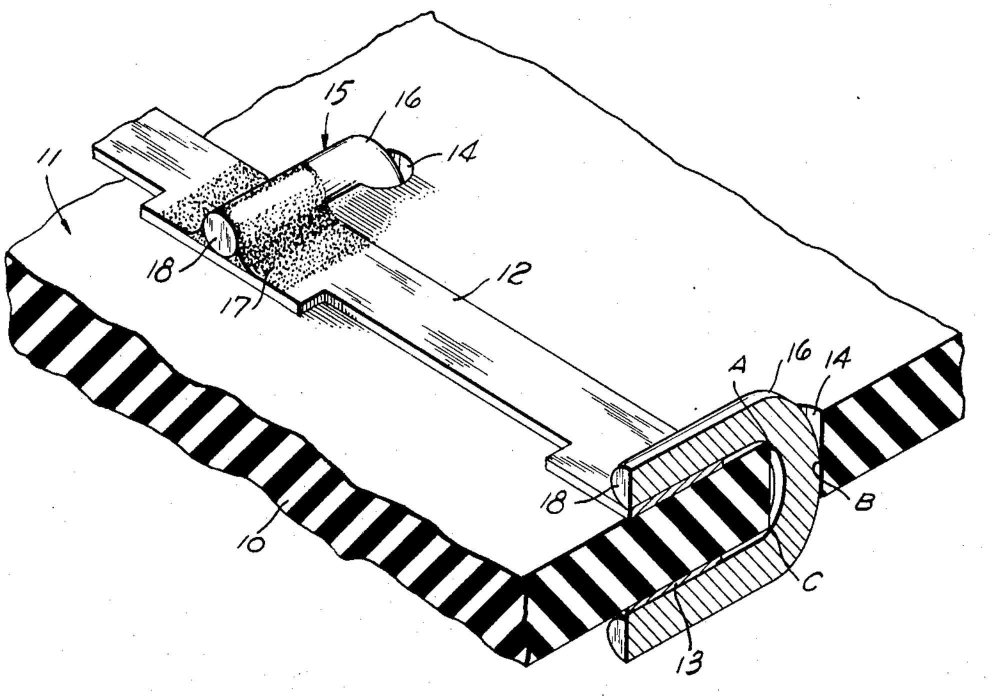
Figure 1B:
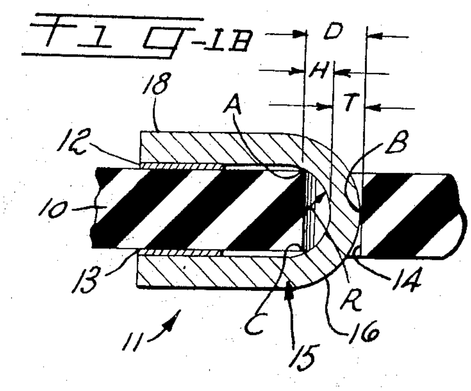

Referring to FIGS. 1*a* and 1*b* for a further consideration of the natural bend of the wire connector 15 natural bending occurs about inner edges A and C of the hole 14 and along a natural bending radius R, so that the natural bend or arc described has a maximum height H, as measured from an imaginary base line drawn between the inner edges A and C to the highest point on the inner arcuately bent surface of the wire connector 15. To permit such natural bending, the hole 14 must have a minimum dimension diametrically opposed to the circuit paths 12 and 13 which is substantially equal to the sum of the height H of the natural arc described by the wire connector 15 plus the thickness T of such wire connector 15. When natural bending occurs along the natural bending radius R the inner surface of the wire abuts the inner edges A and C and the arcuately bent outer surface of the wire 15 is moved into juxtaposition with the hole wall at the point B diametrically opposite both to the inner edges A and C of the hole 14 and to the circuit paths 12 and 13 as clearly shown in FIGS. 1*a* and 1*b*.

The hole 14 is spaced a sufficient distance from the circuit paths 12, 13 so that he bends of the wire at 16—16 are free from becoming a part of the soldered connection. It has been found that not only is a better solder fillet 17 acquired when the wire bends 16—16 are not a part thereof but that the flexibility of the wire is enhanced during any thermal stresses and shocks imparted to the board thereby minimizing, if not totally eliminating, any cracking or opening of the solder connection. Also, with the hole 14 located external the circuit paths 12, 13, no gaseous pockets can be acquired within the soldered connections, which generally was the case when holes were located internal the circuit paths thus enabling solder flux entrapments to build up within the holes, during soldering, and ultimately to expand and lodge in the solder connections. Consequently, with the positioning of a hole 14 spaced from the circuit paths, as disclosed herein, there is an elimination of relatively unstable soldered connections as formerly obtained. The spacing of the hole is dependent upon the thickness of the board and the dimensions of the circuit paths and hole. Generally, success has been obtained in soldering approximately one-third the length of the bent end portions 18—18 extending from their free ends to the circuit paths.

Figure 2:
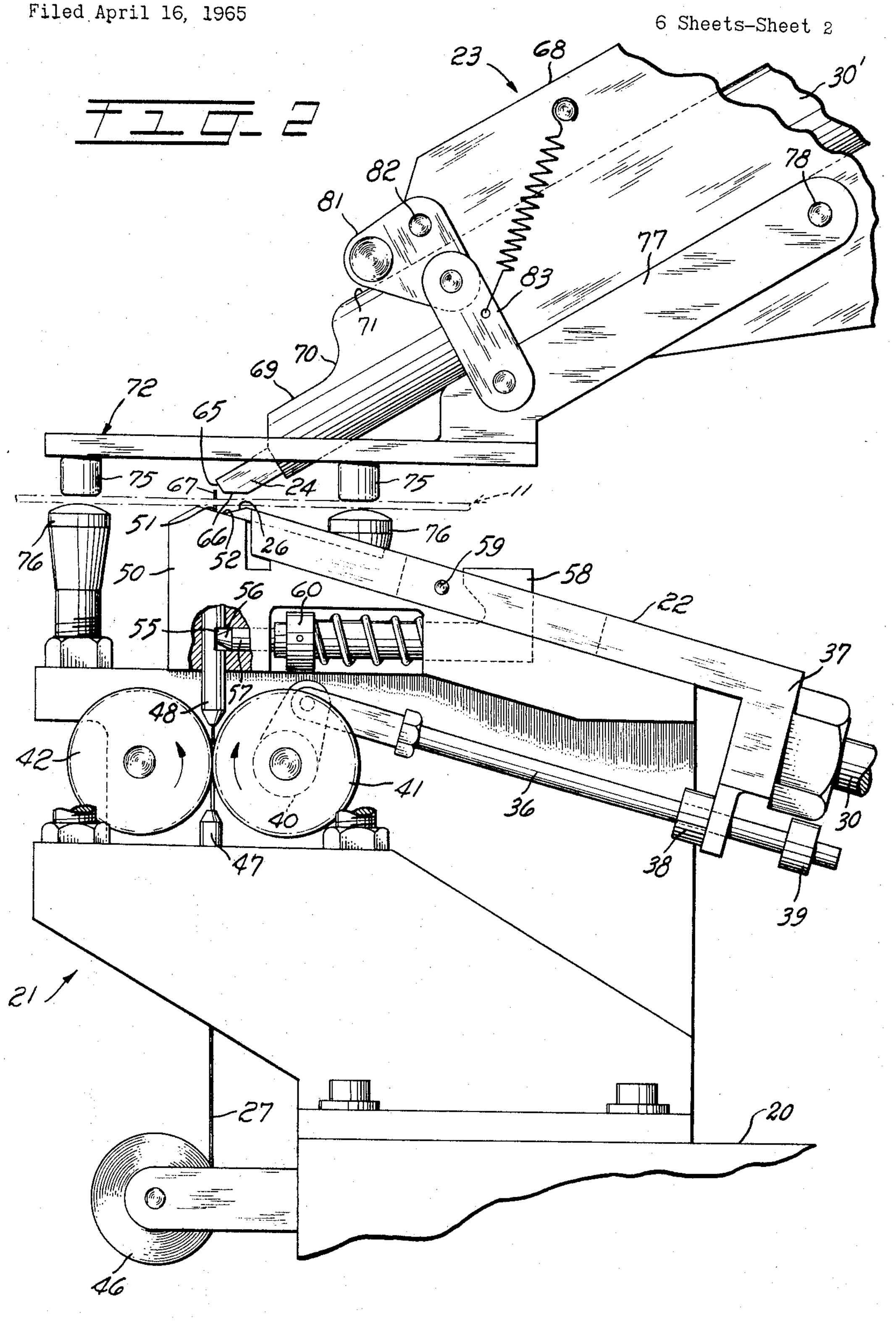
FIG. 2 is a side elevational view of an apparatus utilized for forming wire connectors in the fabrication of the circuit board.

With respect to forming a connector 15, it may be done either manually or by an apparatus disclosed in copending application of E. T. Stocker, Ser. No. 448,817, filed Apr. 16, 1965, now U.S. Patent 3,289,909 as illustrated in FIG. 2. The concept of natural bending is more fully disclosed in U.S. Patent 3,213,894. The apparatus includes a frame 20 for supporting a lower unit 21 which includes a cutting and forming tool 22 and an upper unit 23 which includes a bending tool 24.

Figure 3:
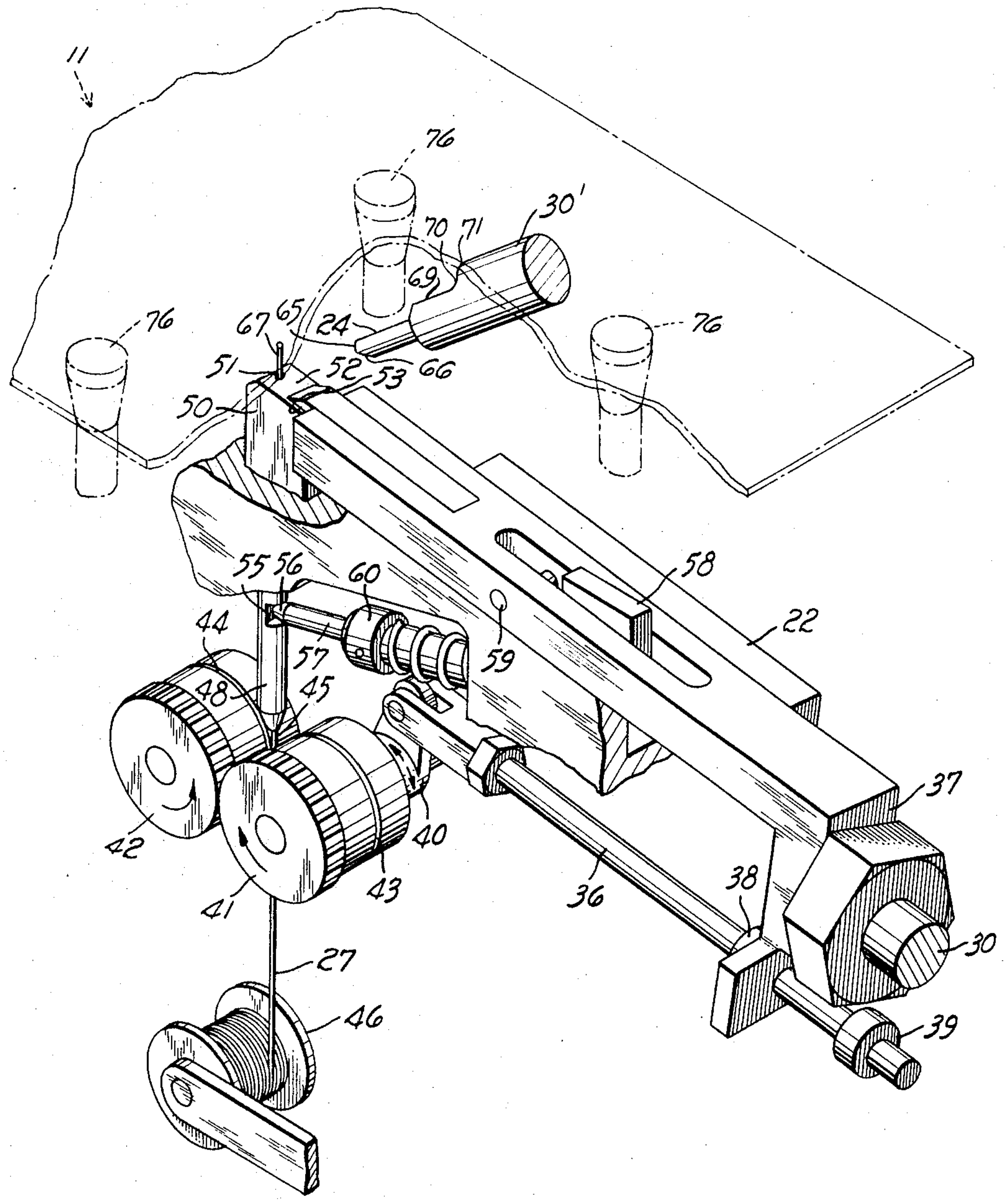
FIG. 3 is an enlarged fragmentary view of the apparatus depicting the wire feeding and clamping means.
Figure 4:
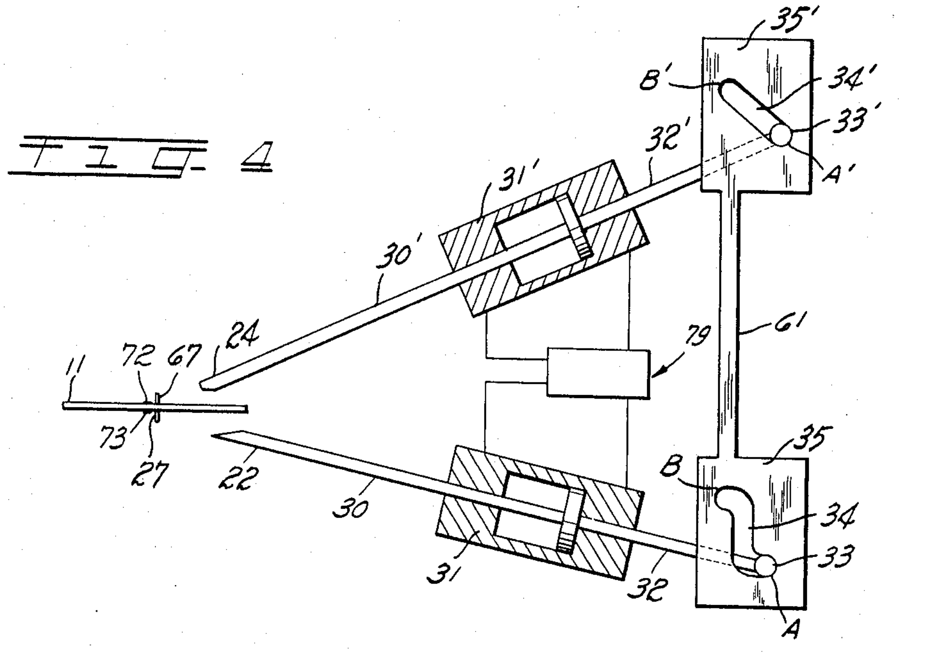
FIG. 4 is a schematic view depicting the respective drive means for the bending tool and the forming and cutting tool, when in their normally retracted positions, prior to forming a connector.
Figure 5:
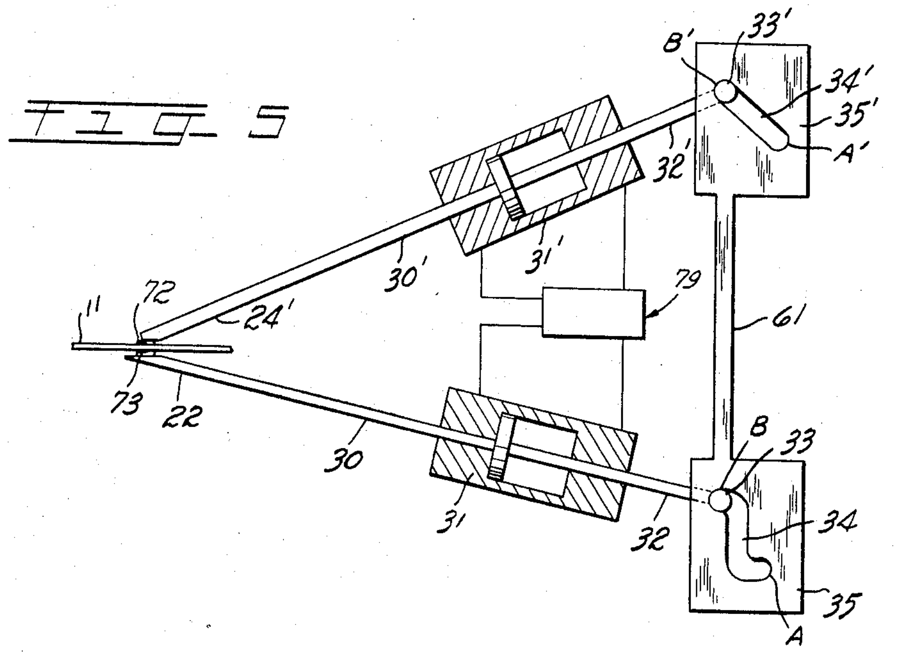
FIG. 5 is a schematic view depicting the respective drive means for the bending tool, and the forming and cutting tool, when in their extended positions, after forming a connector.

The cutting and forming tool 22 is provided with an angular cutting edge 25 (FIGS. 3, 8 and 9) and a substantially flat forming edge 26 contiguous therewith for respectively cutting a wire 27 having a solder or solder flux outer coating, and bending it to a desired position during the forming and clinching of a connector 15 (FIG. 9). The cutting and forming tool 22 is connected to and driven by a forward piston rod 30 (FIGS. 2, 3, 4, and 5) of an air cylinder 31 also having a rearward piston rod 32 provided with a cam follower 33 for travel within a formed slot 34 of a cam 35. A shaft 36 extends through an end portion 37 of the cutting and forming tool 22 and is provided with collars 38 and 39 located on either side of said end portion. The other end of the shaft 36 is connected to an indexing clutch 40 operable for controlling the rotation of a spur gear 41 in mesh with a spur gear 42. As seen in FIG. 3, the spur gears 41 and 42 have respective circumferential grooves 43 and 44 which form an opening 45 therebetween for snugly receiving the wire 27 from a supply reel 46.

Tubular guides 47 and 48 are axially aligned with opening 45 on either side thereof, guide 47 extending from frame 20 and guide 48 being connected to a die 50 such that it communicates with a passage 51 therein. The top surface 52 of die 50 is inclined at an angle in the same plane as the bottom surface 53 of the cutting and forming tool 22, as seen in FIGS. 3, 8, and 9. With such structure, the cutting of the wire 27 by cutting edge 25 and the bending thereof by the flat forming edge 26 is facilitated as described hereinafter. Die 50 is provided with a slot 55 disposed normal to its passage 51 for receiving a clamping end 56 of a clamp 57, the other end 58 of the clamp normally held in engagement with a pin 59 extending from the cutting and forming tool 22 to hold the clamp in a retracted position (FIG. 3). The clamp 57 is provided with a spring 60 which tends to urge clamp end 56 through slot 55 to contact and hold the wire 27 during the forming and connecting of the connector 15 (FIGS. 2, 8, and 9).

Figure 6:
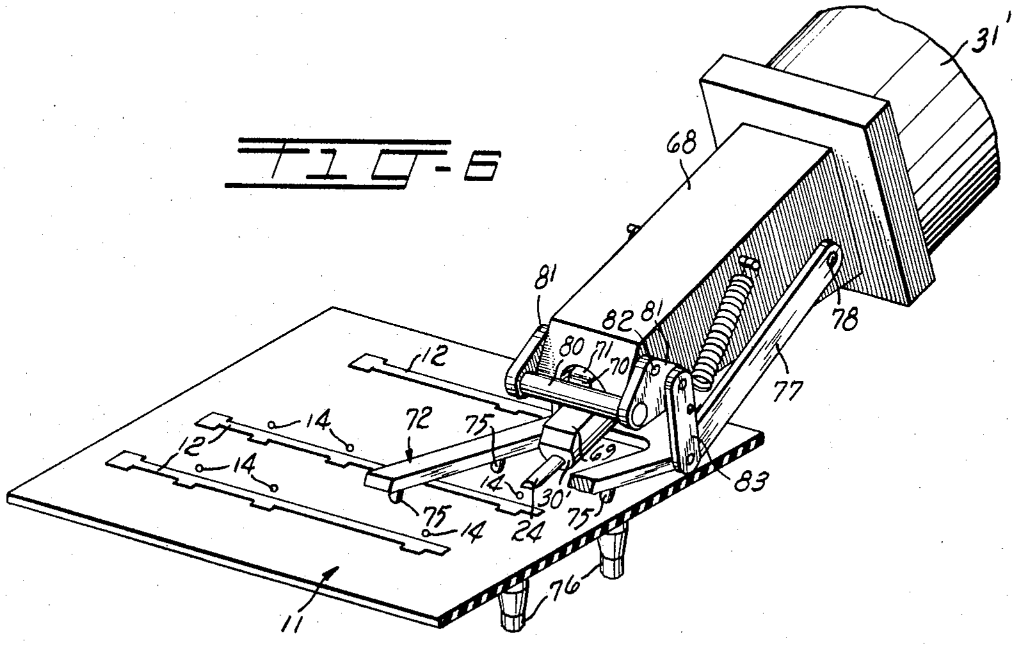
FIG. 6 is an enlarged fragmentary view depicting the bending tool in its normally retracted position and of the circuit board holder in its open position.
Figure 7:
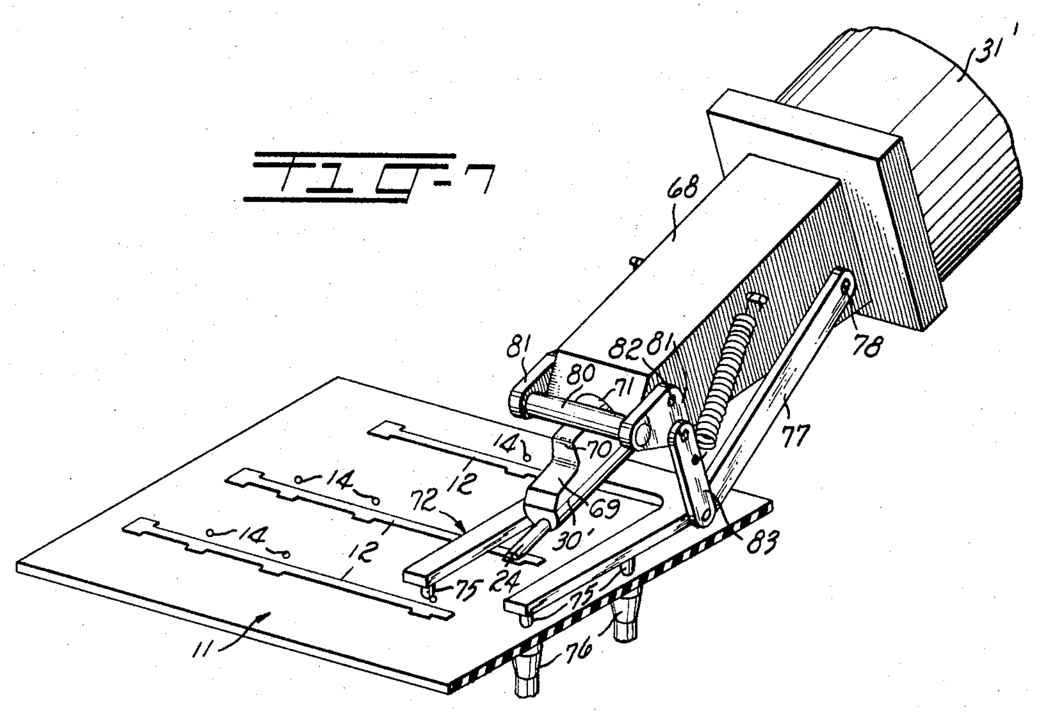
FIG. 7 is an enlarged fragmentary view depicting the bending tool in its extended position for partially forming the connector and of the circuit board holder in its closed position.

With respect to the upper unit 23, the bending tool 24 includes bevelled surfaces 65, 66 for respectively engaging and bending the end 67 (FIG. 8) of wire 27. The bending tool 24 is connected to and driven by a forward piston rod 30′ of an air cylinder 31′ also having a rearward piston rod 32′ provided with a cam follower 33′ for travel within a formed slot 34′ of a cam 35′ which is connected to cam 35 by member 61. As seen in FIGS. 2, 6, and 7, the forward piston rod 30′ extends through a housing 68 and is provided with a lower flat surface 69 which contours arcuately at 70 and then extends along a relatively higher flat surface 71 for cam controlling the movement of a toggle holder 72 for holding a manually inserted circuit board 11.

The holder 72 is substantially U-shaped and provided with a plurality of supporting legs 75—75 for engaging the top surface of circuit board 11 and clamping it against a plurality of supporting legs 76—76 extending upwardly from the lower unit 21. The holder 72 is provided with a pair of arms 77—77 pivotally mounted at 78—78 to the housing 68. A roller 80 is supported by end members 81—81 which are mounted at 82—82 to the housing 68, the end members being connected by spring-loaded links 83—83 to the arms 77—77, respectively.

In operation, the wire 27, for forming and clinching a circuit path 12 on the top surface of the circuit board 11 to a circuit path 13 on the bottom surface of the circuit board, is threaded from the supply reel 46, through guide 47, the opening 45, the tubular guide 48 through passage 51 in die 50 to a position such that the wire end 67 is located slightly above the die. The operator then positions the circuit board 11 upon the suporting legs 76 and, in so doing, inserts the required circuit board hole 14 through which the connector 15 is to be made over the wire end 67. The operator depresses a foot pedal (not shown) which operates a conventional control unit, generally indicated at 79 to simultaneously energize air cylinders 31, 31′. As seen in FIGS. 6 and 7, respectively, during the initial phase of the forward stroke of piston rod 30′, its arcuate surface 70 passes beneath roller 80 which causes the holder end members 81—81 to pivot in a clockwise direction and urge links 83—83 downwardly thereby resulting in the U-shaped holder 72 moving downwardly with its supporting legs 75 engaging and clamping the circuit board 11 in a locked position. Simultaneously, during the initial phase of the stroke of piston rod 30′, the cutting and forming tool 22 moves forward from collar 39 to collar 38, pin 59 to move from clamp end 58 and release tension on spring 60 for enabling clamp 57 to advance until its clamping end 56 engages and locks the wire 27.

As seen in FIGS. 8 and 9, respectively, after the board 11 and the wire 27 are locked, further advance of formed piston rod 30′ to complete its stroke results in the bevelled surfaces 65 and 66 of bending tool 24 to respectively bend the wire naturally so that the end portions 18—18 are at a substantial right angle to the axis of the hole 14 as shown in FIGS. 1*a* and 1*b* and clinch the wire end 67 firmly against the circuit 12. During this phase of the stroke of forward piston rod 30′, rearward piston rod 32′ also advances thereby moving cam follower 33′ along slot 34′ of cam 35′ from position A′ to position B′, which, in turn, moves cam 35′ downwardly. As a result, cam 35 is moved downwardly by member 61 thereby permitting cam follower 33 on rearward piston rod 32 of air cylinder 31 to move forward from position A′ to B′. Accordingly, the cutting and forming tool 22 inclinedly advances so that the cutting edge 25 cuts the wire 27 and continued advance of the tool results in its forming edge 26 naturally bending the wire at a substantial right angle to the axis of the hole 14 and wiping the wire firmly against circuit 13. Thus, at the end of the forward stroke of forward piston rods 30, 30', a portion of the wire 27 has been severed, formed into a connector 15 and interconnected to circuits 12 and 13 (FIGS. 8 and 9).

During the return stroke of forward piston rod 30' the U-shaped holder 72 releases from board 11 and the bending tool 24 retracts to its normal inoperable position. Simultaneously, the return stroke of forward piston rod 30 causes the cutting and forming tool 22 to retract to its normal inoperable position. During this movement, when the cutting and forming tool 22 moves from collar 38 to collar 39 to feed the wire, pin 59 engages and moves clamp 57 to the right so that its clamping end 56 is withdrawn from the wire 27. When collar 39 is contacted, further movement of the cutting and forming tool to the end of its return stroke causes shaft 36 to move to the right which, in turn, results in clutch 40 engaging spur gear 41 and rotating it in a clockwise direction. Rotation of the spur gears 41 and 42 advances a predetermined length of wire 27 upwardly through die 50, and the apparatus is ready for another cycle.

After a connector 15 has been clinched to interconnect circuits 12 and 13, the board 11 is removed from the apparatus for soldering. The soldering may be effected, either by manually operated tools or by exposing the boards 11 to a mass soldering facility (not shown). In either event, a desirable solder fillet 17 is obtained which is capable of remaining intact when the circuit board is subjected to shock or relatively high thermal stresses caused by a difference in the thermal coefficient of expansion between the board material and the solder alloy used for making the soldered connections.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

1. The method of forming and clinching connectors to preselected areas disposed on opposite sides of a circuit board, which comprises:

forming a hole in the circuit board a predetermined distance from the preselected areas, feeding a predetermined length of strand material through said hole such that the one end of the strand material extends beyond one side of the circuit board, bending said one end of the strand material firmly against a preselected area on said one side of the circuit board, cutting the strand material extending beyond the other side of the circuit board, and bending the cut end of said severed strand material against a preselected area on the other side of the circuit board so as to form a connector which interconnects the latter preselected area with the former preselected area.

2. The method of forming and clinching connectors to preselected areas of circuitry disposed on opposite sides of a circuit board, which comprises:

forming a hole in the circuit board a predetermined distance from the preselected areas, feeding a predetermined length of wire through the circuit board hole such that one end of the wire extends beyond one side of the circuit board, bending said one end of the wire firmly against a preselected area on said one side of the circuit board, cutting the wire extending beyond the other side of the circuit board, and bending the cut end of the wire firmly against a preselected area on said other side of the circuit board so as to form a connnector which interconnects the latter preselected area with the former preselected area.

3. The method of forming and clinching connectors to preselected areas of circuitry disposed on opposite sides of a circuit board, which comprises:

forming a hole in the circuit board a predetermined distance from the preselected areas, feeding a predetermined length of wire through the circuit board hole such that one end of the wire extends beyond one side of the circuit board, temporarily clamping the wire extending from the other side of the circuit board, bending said one end of the wire firmly against a preselected area on said one side of the circuit board, cutting the wire extending beyond the other side of the circuit board at a point between said other side of the circuit board and the temporary clamping thereof, and bending the cut end of the wire firmly against a preselected area on said other side of the circuit board so as to form a connector which interconnects the latter preselected area with the former preselected area.

4. The method of forming and connecting connectors to preselected areas of circuitry disposed on opposite sides of a circuit board, which comprises:

forming a hole in the circuit board a predetermined distance from the preselected areas, feeding a predetermined length of wire through the circuit board hole such that one end of the wire extends beyond one side of the circuit board, bending said one end of the wire firmly against a preselected area on said one side of the circuit board, cutting the wire extending beyond the other side of the circuit board, bending the cut end of the wire firmly against a preselected area on said other side of the circuit board, so as to form a connector which connects the latter preselected area with the former preselected area, and joining the bent one end and cut end of the wire to their respective preselected areas.

5. The method of forming and connecting connectors to preselected areas of circuitry, disposed on opposite sides of a circuit board, which comprises:

forming a hole in the circuit board a predetermined distance from the preselected areas, feeding a predetermined length of wire having an outer surface of solder thereon through the circuit board hole such that one end of the wire extends beyond one side of the circuit board and a portion of the wire extends beyond the other side of the circuit board, bending said one end of the wire firmly against a preselected area on said one side of the circuit board, cutting the wire portion extending beyond the other side of the circuit board, bending the cut end of the wire portion firmly against a preselected area on said other side of the circuit board, so as to form a connector which interconnects the latter prescribed area with the former preselected area, and heating the bent one end and cut end of the wire to melt the solder surface and thereby permanently join said bent ends to their respective preselected areas.

6. The method of forming and connecting connectors to preselected areas of circuitry disposed on opposite sides of a circuit board, which comprises:

forming a hole in the circuit board a predetermined distance from the preselected area, feeding a predetermined length of wire having an outer surface of solder flux thereon through the circuit board hole such that one end of the wire extends above one side of the circuit board and a portion of the wire extends beyond the other side of the circuit board, bending said one end of the wire firmly against a preselected area on said one side of the circuit board, cutting the wire portion extending beyond the other side of the circuit board, bending the cut end of the wire portion firmly against a preselected area on said other side of the circuit board, while holding the bent one end of the wire, so as to form a connector which interconnects the later prescribed area with the former prescribed area, and soldering the bent one end and cut end of the wire to permanently join said bent ends to their respective preselected areas.

7. The method of forming and connecting connectors to preselected areas of circuitry disposed on opposite sides of a circuit board, which comprises:

forming a hole in the circuit board a predetermined distance from the preselected area, feeding a predetermined length of wire having an outer surface of solder flux thereon through the circuit board hole such that one end of the wire extends above one side of the circuit board and a portion of the wire extends beyond the other side of the circuit board, temporarily clamping the wire extending from the other side of the circuit board, bending said one end of the wire firmly against a preselected area on said one side of the circuit board, cutting the wire portion extending beyond the other side of the circuit board, bending the cut end of the wire portion firmly against a preselected area on said other side of the circuit board, while holding the bent one end of the wire, so as to form a connector which interconnects the latter prescribed area with the former prescribed area, and soldering the bent one end and cut end of the wire to permanently join said bent ends to their respective preselected areas.

8. A circuit board, which comprises:

a dielectric substrate, paths of circuitry located on opposite sides of the substrate, at least one hole remote from the circuitry paths, the hole extending through the substrate and being spaced a predetermined distance from preselected areas of the circuitry paths, and a conductive strand extending through the hole and being naturally bent within said hole interconnecting the circuitry paths with end portions of said strand respective preselected areas of circuitry.

9. A circuit board, which comprises:

a dielectric substrate, paths of circuitry located on opposite sides of the substrate, at least one hole remote from the circuitry paths, the hole extending through the substrate and being spaced a predetermined distance from preselected areas of the circuitry paths, and a wire extending through the hole and being naturally bent within said hole clinching and interconnecting end portions of said wire to the respective preselected areas of the circuitry paths.

10. A circuit board, which comprises:

a dielectric substrate, paths of circuitry located on opposite sides of the substrate, at least one hole remote from the circuitry paths, the hole extending through the substrate and being spaced a predetermined distance from preselected areas of the circuitry paths, and a wire having a diameter smaller than the diameter of the hole and being naturally bent within the hole to facilitate soldering of end portions of the wire to the respective areas of the circuitry paths.

11. A circuit board according to claim 10 wherein the bent end portions are naturally bent within the hole at substantial right angles to the major axis of said hole.

12. A circuit board, which comprises:

a dielectric substrate, paths of circuitry located on opposite sides of the substrate, at least one hole remote from the paths, the hole extending through the substrate and having end portions spaced a predetermined distance from preselected areas of the circuitry paths, and a wire having a diameter smaller than the diameter of the hole and being bent so that end portions of the wire are soldered to respective areas of the circuitry paths, the contour of the wire extending through the hole being such that it makes only point contacts with the walls of said hole for accommodating any stresses acquired in the board to thereby protect the soldered portions, wherein:

(a) said wire contour is a natural arc described by naturally bending said wire about said hole edges, and (b) said point contact occurs at three points comprising:

(i) the points of engagement of said naturally bent wire and said bending edges, and (ii) the point of engagement of the highest point on said natural arc and a wall of said hole diametrically opposed both to said bending edges and to said paths.

13. A printed wiring board having interconnected circuit paths on opposite sides thereof comprising:

an aperture in said board spaced from areas of said paths to be interconnected, said aperture having a predetermined minimum dimension greater than the thickness of a wire inserted therein, and a wire inserted through said aperture with the end portions thereof being bent about opposite edges of the aperture toward each other, the portion of the wire within the aperture following a natural bend and said end portions being clinched against said areas of said paths to interconnect said paths.

14. A method of connecting a wire lead having a predetermined natural bending arc to circuit paths formed on directly opposite sides of a substrate which comprises:

forming a hole having inner edges and walls through said substrate, said hole having a minimum dimension diametrically opposed to said circuit paths which is substantially equal to the thickness of the wire lead plus the maximum height of said arc described by the natural bending of the inner side of the wire lead about said edges, placing a length of said wire lead through said hole with opposed ends projecting from said hole a distance sufficient to be bent naturally into respective engagement with said circuit paths, applying bending forces to the projecting ends of said wire lead to bend said wire lead about said inner edges of said hole and along said natural bending arc to move said opposed ends into respective engagement with said circuit paths so that the natural bending of the wire lead moves the arcuate outer surface of the bent wire lead into juxtaposition with the hole wall opposite to said inner edges, and then, applying solder to the ends of said wire lead engaging said circuit paths.

15. A method of interconnecting circuit paths formed on directly opposite sides of a substrate with a wire lead which, when naturally bent about a pair of spaced bending points, describes a natural arc, the natural arc having a maximum dimension equal to the thickness of the wire lead plus the maximum height of the arc as measured from a base line drawn between the spaced bending points to the highest point on the inner bent surface of the wire lead, which comprises the steps of:

(a) forming an aperture having inner edges and walls through said substrate with the inner edges and the walls of said aperture being spaced from said circuit paths, (i) said aperture having a minimum width equal to said maximum dimension of said natural arc, said minimum width being measured between said inner edges and one of said walls along a line diametrically opposed to said circuit paths, (ii) said inner edges being located respectively at said spaced bending points, (b) placing a length of said wire lead through said aperture with opposed ends thereof projecting sufficiently from said aperture to be naturally bent into respective engagement with said paths, (c) applying bending forces to said lead ends for naturally bending said lead about said inner edges to contact said paths respectively with said lead ends, whereby the outer bent surface of said naturally bent lead contacts said wall, and then, (d) soldering said lead ends to said circuit paths.

References Cited

UNITED STATES PATENTS

| | | | |
|---|---|---|---|
| 2,441,960 | 5/1948 | Eisler. | |
| 2,966,652 | 12/1960 | Parstorfer | 339—17 |
| 3,210,745 | 10/1965 | Dadamo et al. | |

DARRELL L. CLAY, *Primary Examiner.*

UNITED STATES PATENT OFFICE

CERTIFICATE OF CORRECTION

Patent No. 3,361,869 January 2, 1968

Ernst A. Gutbier et al.

It is certified that error appears in the above identified patent and that said Letters Patent are hereby corrected as shown below:

Column 2, line 32, after "For" insert -- the --; line 34, cancel "of", first occurrence. Column 3, line 12, "he" should read -- the --. Column 7, line 50, "conductive" should read -- conducting --; line 52, after "strand" insert -- engaging said --.

Signed and sealed this 29th day of July 1969.

(SEAL)

Attest:

Edward M. Fletcher, Jr.
Attesting Officer

WILLIAM E. SCHUYLER, JR.
Commissioner of Patents